(12) United States Patent
Nakamura et al.

(10) Patent No.: US 11,201,132 B2
(45) Date of Patent: Dec. 14, 2021

(54) METHOD FOR SETTING CONDITIONS FOR HEATING SEMICONDUCTOR CHIP DURING BONDING, METHOD FOR MEASURING VISCOSITY OF NON-CONDUCTIVE FILM, AND BONDING APPARATUS

(71) Applicant: SHINKAWA LTD., Tokyo (JP)

(72) Inventors: Tomonori Nakamura, Tokyo (JP); Toru Maeda, Tokyo (JP); Satoru Nagai, Tokyo (JP); Yoshihiro Saeki, Tokyo (JP); Osamu Watanabe, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 86 days.

(21) Appl. No.: 16/651,334

(22) PCT Filed: Sep. 14, 2018

(86) PCT No.: PCT/JP2018/034203
§ 371 (c)(1),
(2) Date: May 19, 2020

(87) PCT Pub. No.: WO2019/065309
PCT Pub. Date: Apr. 4, 2019

(65) Prior Publication Data
US 2020/0286854 A1    Sep. 10, 2020

(30) Foreign Application Priority Data
Sep. 28, 2017   (JP) .............................. JP2017-187921

(51) Int. Cl.
*H01L 23/00*   (2006.01)
*H01L 21/66*   (2006.01)
*H01L 21/56*   (2006.01)

(52) U.S. Cl.
CPC .............. *H01L 24/83* (2013.01); *H01L 24/75* (2013.01); *H01L 21/563* (2013.01); *H01L 22/20* (2013.01);
(Continued)

(58) Field of Classification Search
CPC . H01L 2224/83862; H01L 2224/83855; H01L 2224/88097; H01L 2224/83908; H01L 21/563; H01L 22/20; H01L 22/26
See application file for complete search history.

(56) References Cited

U.S. PATENT DOCUMENTS

2016/0194517 A1   7/2016   Saito et al.
2017/0301597 A1   10/2017  Hoshiyama et al.

FOREIGN PATENT DOCUMENTS

| JP | 2008145273 | 6/2008 |
| JP | 2015056500 | 3/2015 |
| WO | 2016056619 | 4/2016 |

OTHER PUBLICATIONS

"International Search Report (Form PCT/ISA/210) of PCT/JP2018/034203," dated Oct. 23, 2018, with English translation thereof, pp. 1-4.

*Primary Examiner* — David A Zarneke
(74) *Attorney, Agent, or Firm* — JCIPRNET

(57) ABSTRACT

Provided is a method for setting the conditions for heating a semiconductor chip during bonding of the semiconductor chip using an NCF, wherein a heating start temperature and a rate of temperature increase are set on the basis of a viscosity characteristic map that indicates changes in viscosity with respect to temperature of the NCF at various rates of temperature increase and a heating start temperature characteristic map that indicates changes in viscosity with (Continued)

respect to temperature of the NCF when the heating start temperature is changed at the same rate of temperature increase.

9 Claims, 6 Drawing Sheets

(52) U.S. Cl.
CPC ...... *H01L 22/26* (2013.01); *H01L 2224/7592* (2013.01); *H01L 2224/75301* (2013.01); *H01L 2224/83097* (2013.01); *H01L 2224/83201* (2013.01); *H01L 2224/83855* (2013.01); *H01L 2224/83908* (2013.01)

METHOD FOR SETTING CONDITIONS FOR HEATING SEMICONDUCTOR CHIP DURING BONDING, METHOD FOR MEASURING VISCOSITY OF NON-CONDUCTIVE FILM, AND BONDING APPARATUS

CROSS-REFERENCE TO RELATED APPLICATION

This application is a 371 application of the International PCT application serial no. PCT/JP2018/034203, filed on Sep. 14, 2018, which claims the priority benefit of Japan Patent Application No. 2017-187921, filed on Sep. 28, 2017. The entirety of each of the abovementioned patent applications is hereby incorporated by reference herein and made a part of this specification.

TECHNICAL FIELD

The present invention relates to a method for setting conditions for heating a semiconductor chip during bonding, a method for measuring viscosity of a non-conductive film by using a bonding device, and a structure of the bonding device.

RELATED ART

There is proposed a method for measuring viscosity of a resin by sandwiching the resin from top and bottom and heating and melting the resin, when resin sealing of a semiconductor chip is performed, and detecting spread of the resin during the melting (for example, see Patent Literature 1).

In addition, there is known a method for measuring viscosity of a sample on the basis of changes in thickness of the sample when the sample being cylindrical is sandwiched between parallel plates and a load is applied thereto (see Non Patent Literature 1).

LITERATURE OF RELATED ART

Patent Literature

Patent Literature 1: Japanese Patent Laid-Open No. 2008-145273

Non Patent Literature

Non Patent Literature 1: Ultra-wide Range Viscometer Based on Indentation, Parallel Plate Creep-rotational Methods, and Its Characteristics by SHIRAISHI, Yutaka et al, in Journal of the Japan Institute of Metals and Materials, Vol. 60, No. 02 (1996), pp. 184 to 191

SUMMARY

Problems to be Solved

Meanwhile, flip chip bonding is used, in which a semiconductor chip having a metal bump formed on an electrode is inverted, and the metal bump is melted such that an alloy is formed between the electrode and an electrode of a substrate, and thereby the semiconductor chip is joined to the substrate. In the bonding, a thermosetting non-conductive film (hereinafter, referred to as an NCF) is used to fill a gap between the semiconductor chip and the substrate. The NCF is attached on the metal bump of the semiconductor chip. When the semiconductor chip is heated, the NCF is softened before the metal bump is melted, enters the gap between the semiconductor chip and the substrate and starts to be cured with heat when the temperature further increases. Besides, after the NCF starts to be cured with heat, the metal bump is melted to form an alloy between the semiconductor chip and the electrode of the substrate, and thereby the semiconductor chip is joined to the substrate.

However, curing during heating may be delayed depending on the type of the NCF, and the metal bump may start to be melted in a state that the NCF is softened. In this case, flow of the softened NCF causes the melted metal bump to flow, the shape of the alloy with which the semiconductor chip is joined to the substrate is distorted, and the semiconductor chip may not be appropriately joined to the substrate.

Hence, in order to perform appropriate bonding, it is important to know characteristics of changes in viscosity of the NCF with respect to temperatures. However, the characteristics of changes in viscosity of the NCF with respect to temperature vary significantly due to various factors such as a heating rate or a heating start temperature of the NCF. Hence, bonding tests are conducted by changing various parameters such as the heating rate or the heating start temperature of the NCF, and thus it is necessary to determine conditions for heating a semiconductor chip during bonding. Here, a problem arises in that it takes time to set conditions for bonding.

In this respect, an objective of the present invention is that conditions for heating a semiconductor chip during bonding can be set in a short time.

Means to Solve Problems

The heating condition setting method of the present invention is a method for setting conditions for heating a semiconductor chip during bonding of the semiconductor chip using a non-conductive film, the method including: setting a heating start temperature and a rate of temperature increase on the basis of one or both of a viscosity characteristic map that indicates changes in viscosity with respect to temperature of the non-conductive film at various rates of temperature increase and a heating start temperature characteristic map that indicates changes in viscosity with respect to temperature of the non-conductive film when the heating start temperature is changed at the same rate of temperature increase, wherein the viscosity characteristic map is obtained by measuring a lowered amount of a bonding tool while the temperature of the non-conductive film is increased at the various rates of temperature increase, in a state that the non-conductive film is sandwiched between a bonding stage and the bonding tool and is pressed with a constant load, calculating the viscosity of the non-conductive film on the basis of the lowered amount of the bonding tool, and outputting the calculated viscosity as characteristics of changes in viscosity with respect to temperature of the non-conductive film at various rates of temperature increase.

The heating condition setting method of the present invention is a method for setting conditions for heating a semiconductor chip during bonding of the semiconductor chip using a non-conductive film, the method including: setting a heating start temperature and a rate of temperature increase on the basis of one or both of a viscosity characteristic map that indicates changes in viscosity with respect to temperature of the non-conductive film at various rates of temperature increase and a heating start temperature characteristic map that indicates changes in viscosity with respect to temperature of the non-conductive film when the heating start temperature is changed at the same rate of temperature increase, wherein the heating start temperature characteristic map is obtained by measuring a lowered amount of a bonding tool while the temperature of the non-conductive film is increased from various heating start temperatures at the same rate of temperature increase, in a state that the non-conductive film is sandwiched between a bonding stage and the bonding tool and is pressed with a constant load, calculating the viscosity of the non-conductive film on the basis of the lowered amount of the bonding tool, and outputting the calculated viscosity as characteristics of changes in viscosity with respect to temperature of the non-conductive film when the heating start temperature is changed at the same rate of temperature increase.

In the heating condition setting method of the present invention, in the bonding, a metal bump formed on the semiconductor chip may be melted and an alloy may be formed between the semiconductor chip and an electrode of a substrate or another semiconductor chip to thereby join the semiconductor chip to the substrate or another semiconductor chip, and the non-conductive film is cured with heat so as to fill a gap between the semiconductor chip and the substrate or another semiconductor chip. The setting of the heating start temperature and the rate of temperature increase may be selecting a combination of a heating start temperature and a rate of temperature increase at which viscosity of the non-conductive film is equal to or higher than curing viscosity at a temperature lower than a melting start temperature of the metal bump.

In the heating condition setting method of the present invention, a temperature command to a heater that heats the semiconductor chip may be set on the basis of the set heating start temperature and rate of temperature increase.

Consequently, in the heating condition setting method of the present invention, the conditions for heating a semiconductor chip during bonding can be set in a short time.

The viscosity measuring method of the present invention is a method for measuring viscosity of a non-conductive film by using a bonding device, the method including: measuring a lowered amount of a bonding tool while a temperature of the non-conductive film is increased at a predetermined rate of temperature increase, in a state that the non-conductive film is sandwiched between a bonding stage and the bonding tool and is pressed with a constant load; and calculating the viscosity of the non-conductive film on the basis of the lowered amount of the bonding tool.

The bonding device of the present invention includes: a bonding stage on which a non-conductive film is mounted; a bonding tool that sandwiches the non-conductive film in cooperation with the bonding stage; a bonding head that drives the bonding tool in an up-down direction; a heater that is arranged in the bonding head; and a control unit that adjusts a height of the bonding head and an output of the heater. The control unit measures a lowered amount of the bonding tool while a temperature of the non-conductive film is increased by the heater at a predetermined rate of temperature increase, in a state that the bonding head is lowered to press the non-conductive film with a constant load, and calculates the viscosity of the non-conductive film on the basis of the lowered amount of the bonding tool.

Consequently, the viscosity of the non-conductive film can be simply measured using the bonding device.

Effect

According to the present invention, conditions for heating a semiconductor chip during bonding can be set in a short time.

DESCRIPTION OF THE EMBODIMENTS

Figure 1:
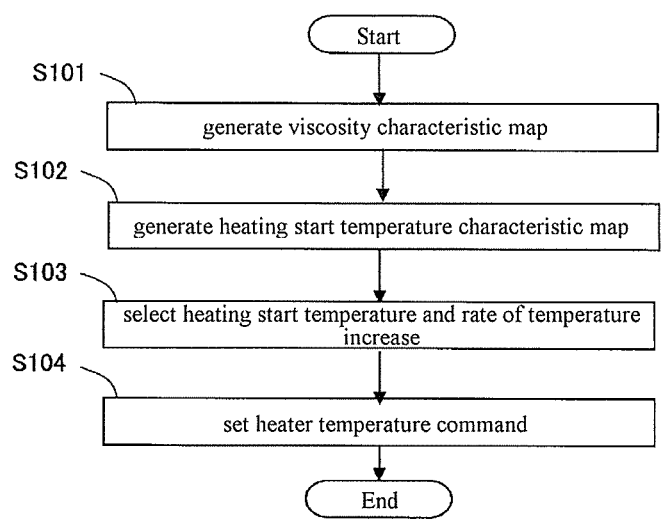
FIG. 1 is a flowchart illustrating a method for setting conditions for heating a semiconductor chip according to an embodiment of the present invention.

Hereinafter, a method for setting heating conditions of an embodiment will be described with reference to the drawings. As illustrated in FIG. 1, the method for setting heating conditions of the embodiment includes a viscosity-characteristic-map generating step represented by step S101 in FIG. 1, a heating-start-temperature-characteristic-map generating step represented by step S102 in FIG. 1, a heating-start-temperature-and-rate-of-temperature-increase selecting step represented by step S103 in FIG. 1, and a heater-temperature-command setting step represented by step S104 in FIG. 1.

Figure 2:
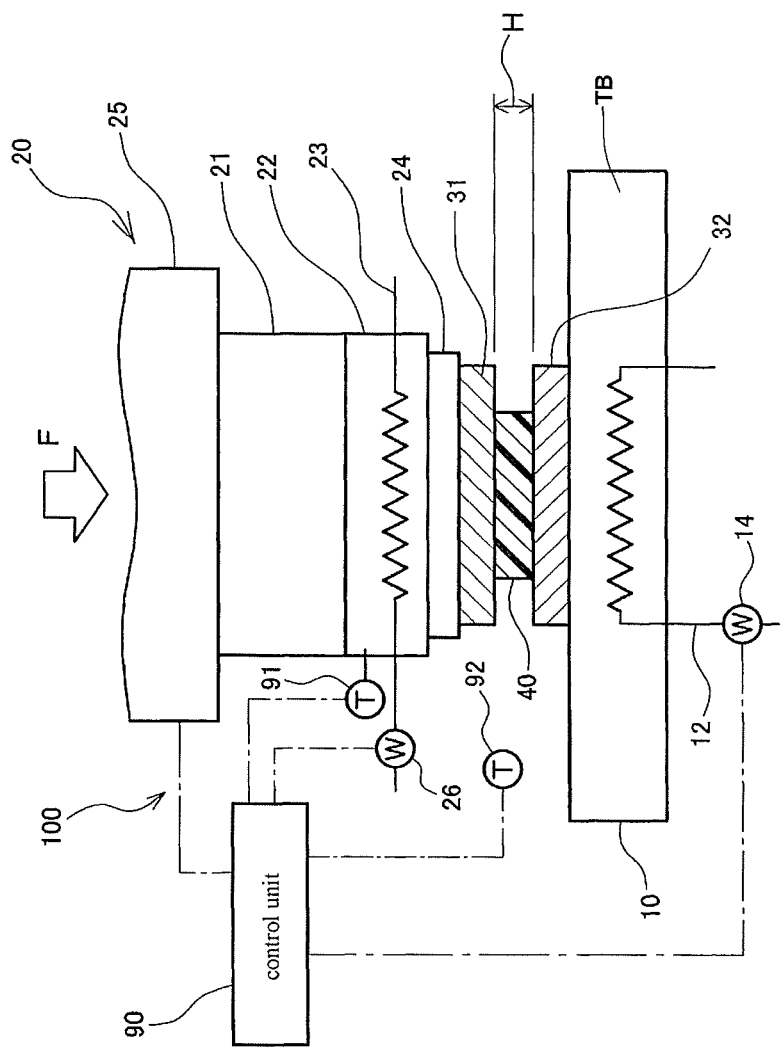
FIG. 2 is a diagram illustrating a state where the viscosity of a non-conductive film (NCF) is measured using a bonding device.

First, the viscosity-characteristic-map generating step is described with reference to FIGS. 2 and 3. As illustrated in FIG. 2, the viscosity of a NCF 40 is measured using a bonding device 100.

As illustrated in FIG. 2, the bonding device 100 includes a bonding stage 10 that vacuum-suctions a semiconductor chip 32 on a surface thereof, a bonding tool 24 that vacuum-suctions a semiconductor chip 31, a bonding head 20, and a control unit 90. The bonding head 20 includes a base 21, a heat block 22 that is attached to the base 21, and a drive unit 25 that drives the base 21 in an up-down direction. The bonding tool 24 is vacuum-suctioned and fixed to the heat block 22. A heater 12 that heats the semiconductor chip 32 is arranged in the bonding stage 10, and a heater 23 that heats the semiconductor chip 31 is arranged in the heat block 22. Controllers 14 and 26 that adjust electric power supply to the heaters 12 and 23 are connected to the heaters 12 and 23, respectively. The control unit 90 is a computer including a CPU and a memory inside.

The drive unit 25 of the bonding head 20 drives the bonding tool 24 in the up-down direction on the basis of a command of the control unit 90 and outputs the height of the bonding tool 24 and a pressing load F of the bonding tool 24 to the control unit 90. A temperature sensor 91 that detects the temperature of the heat block 22 is attached to the heat block 22. In addition, a temperature sensor 92 that detects the temperature of the NCF 40 is attached to the bonding device 100. The temperature sensor 92 may be a non-contact temperature detector. Temperature data acquired by the temperature sensors 91 and 92 is input to the control unit 90.

As illustrated in FIG. 2, the semiconductor chip 32 is vacuum-suctioned onto the bonding stage 10, and the NCF 40 having a thickness H is mounted on the semiconductor chip 32. In addition, the semiconductor chip 31 is vacuum-suctioned on a surface of the bonding tool 24. Besides, the control unit 90 lowers the bonding head 20 to bring the semiconductor chip 31 into contact with the NCF 40, and the NCF 40 is sandwiched between the semiconductor chips 31 and 32. Consequently, the NCF 40 is sandwiched between the bonding stage 10 and the bonding tool 24 via the semiconductor chips 31 and 32. Besides, the control unit 90 lowers the bonding head 20 slightly such that the NCF is pressed with a constant pressing load F. At that time, the temperature of the bonding stage 10 is a temperature TB, and the temperature of the semiconductor chip 31 is a temperature T0.

The control unit 90 controls the controller 26 to increase flowing electric power to the heater 23 while performing adjustment by the drive unit 25 such that the pressing load F is constant, and the control unit 90 increases the temperature of the NCF 40 at a predetermined rate of temperature increase. When the temperature of the NCF 40 increases, the NCF 40 is softened such that the height H is reduced and the bonding tool 24 is lowered. The control unit 90 detects a change of the height H by a lowered amount of the bonding head 20.

Here, when F (N) represents a pressing load that is applied to the NCF 40, H (m) represents the thickness of the NCF 40, t (sec) represents the time, and Q (m$^3$) represents the volume of the NCF 40 of a sample, viscosity V (Pa·S) of the NCF 40 can be calculated from the following expression (for example, see Non Patent Literature 1).

$$V = 2 \times \pi \times F \times H^5 / 3 \times Q \times (-dH/dt)(2 \times \pi \times H^3 + Q) \quad \text{Expression (1)}$$

The control unit 90 increases the temperature of the NCF 40 from T0 at a rate of temperature increase of A (° C./s) and calculates the viscosity V of the NCF 40 from Expression (1) each time the height of the bonding tool 24 is reduced. In this manner, a characteristic curve as illustrated by a solid line a in FIG. 3 is obtained. As illustrated by the solid line a in FIG. 3, the NCF 40 is softened when the temperature increases, and the viscosity V decreases to be equal to or lower than curing viscosity VS. After that, when the temperature further increases, the NCF 40 starts to be cured with heat, and the viscosity V exceeds the curing viscosity VS at a temperature T1. Then, the viscosity of the NCF 40 rapidly increases due to heat curing.

When a test is conducted in the similar manner at a rate of temperature increase of B (° C./s) higher than A (° C./s), as illustrated by a chain line b, the NCF 40 is softened due to an increase in temperature, then, the viscosity V exceeds the curing viscosity VS at a temperature T2 (T2>T1) due to the heat curing, and then the viscosity V rapidly increases. Similarly, when the rate of temperature increase is C (° C./s) (C>B), the viscosity of the NCF 40 exceeds the curing viscosity VS at a temperature T3 (T3>T2) due to the heat curing as illustrated by a two-dot chain line c. In addition, when the rate of temperature increase is D (° C./s) (D>C), the viscosity of the NCF 40 exceeds the curing viscosity VS at a temperature T4 (T4>T3) as illustrated by a circle-plotted line d.

In this manner, when the NCF 40 is heated, the temperature at which the viscosity V exceeds the curing viscosity VS due to the heat curing increases as the rate of temperature increase increases.

Figure 3:
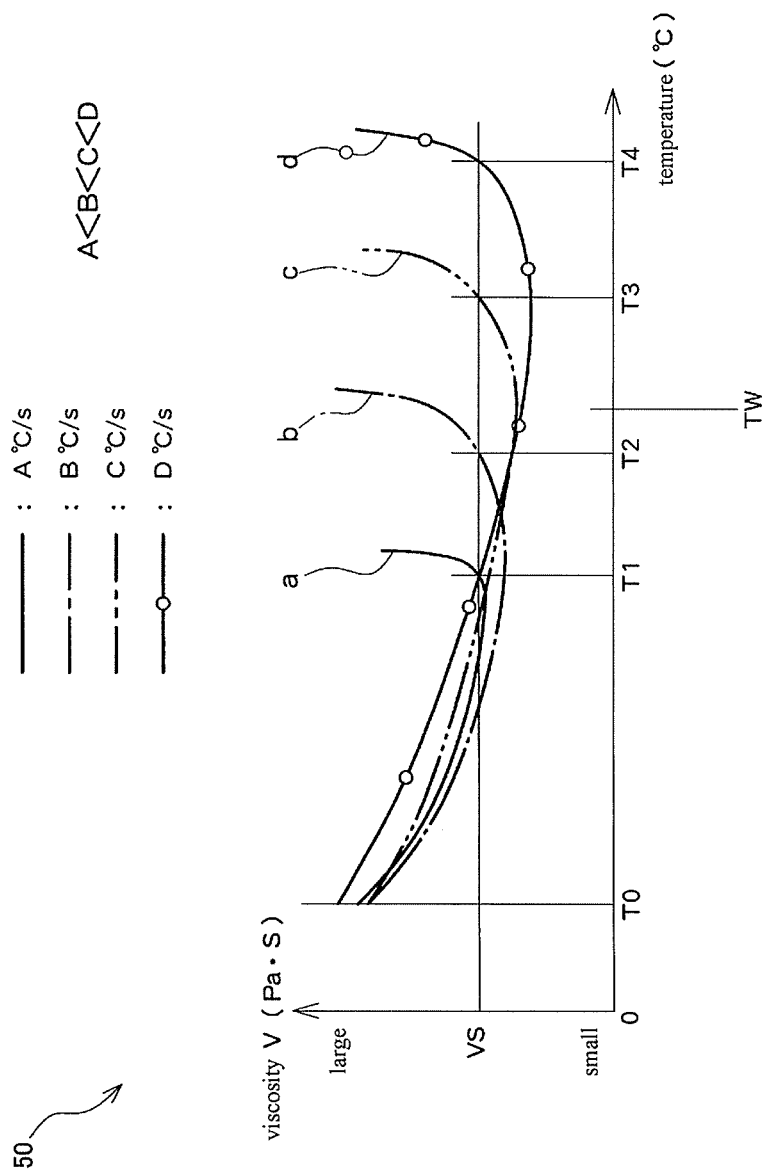
FIG. 3 illustrates an example of a viscosity characteristic map.

A viscosity characteristic map 50 is a map obtained by arranging, on one graph, lines such as the solid line a, the chain line b, the two-dot chain line c, and the circle-plotted line d in FIG. 3, the lines indicating characteristics of changes in the viscosity V with respect to the temperature of the non-conductive film at various rates of temperature increase. A temperature TW in FIG. 3 represents a melting start temperature of a metal bump such as a solder metal bump. This will be described later.

Next, a heating start temperature characteristic map 60 will be described with reference to FIG. 4. A method for measuring the viscosity of the NCF 40 is similar to a case of generating the viscosity characteristic map described above, and thus the description thereof is omitted.

Figure 4:
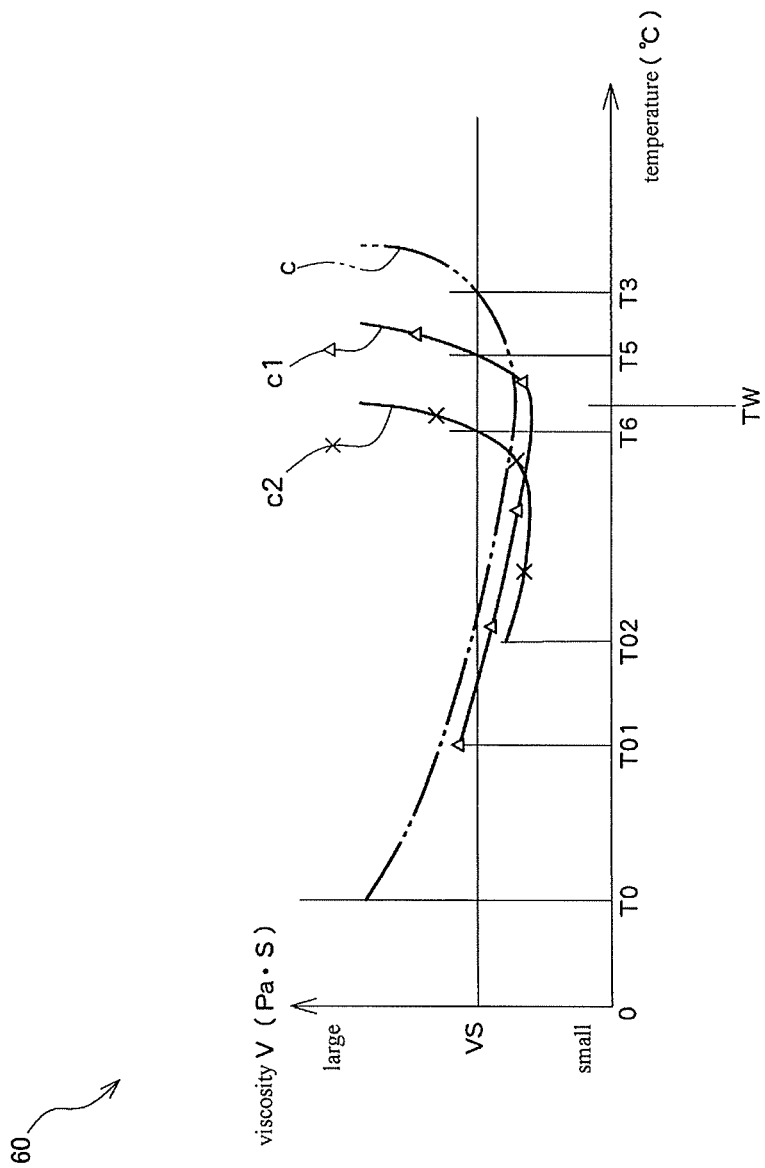
FIG. 4 illustrates an example of a heating start temperature characteristic map.

FIG. 4 illustrates an example of the heating start temperature characteristic map 60. Similarly to the two-dot chain line c in FIG. 3 described above, a two-dot chain line c in FIG. 4 represents changes in the viscosity V of the NCF 40 with respect to the temperature of the NCF 40 when the heating start temperature is T0 and the rate of temperature increase is C (° C./s). A triangle-plotted line c1 in FIG. 4 represents changes in the viscosity V of the NCF 40 with respect to the temperature of the NCF 40 when the heating start temperature is T01 (T01>T0) and the rate of temperature increase is C (° C./s) similar to the two-dot chain line c. NCF 40 exceeds the hardening viscosity VS at temperature T5 by thermal hardening. In addition, an x-plotted line c2 in FIG. 4 represents changes in the viscosity V of the NCF 40 with respect to the temperature of the NCF 40 when the heating start temperature is T02 (T02>T01) and the rate of temperature increase is C (° C./s) similarly to the two-dot chain line c. NCF 40 exceeds the hardening viscosity VS at temperature T6 by thermal hardening.

As illustrated in FIG. 4, as the heating start temperature increases, the temperature at which the viscosity V exceeds the curing viscosity VS decreases. In this manner, the heating start temperature characteristic map is a map obtained by arranging, on one graph, lines such as the two-dot chain line c, the triangle-plotted line c1, and the x-plotted line c2 in FIG. 4, the lines indicating characteristics of changes in viscosity with respect to temperature of the non-conductive film when the heating start temperature is changed at the same rate of temperature increase.

Next, selection of the heating start temperature and the rate of temperature increase illustrated by step S103 of FIG. 1 will be described.

A metal bump formed on the semiconductor chip 31 is melted to form an alloy between the semiconductor chip and an electrode of a substrate, and thereby the semiconductor chip 31 is joined to the substrate. Here, when bonding of filling a gap between the semiconductor chip 31 and the substrate by curing the NCF 40 with heat is performed, the NCF 40 is softened before the metal bump is melted, and the NCF enters the gap between the semiconductor chip 31 and the substrate. Thus, it is important to melt the metal bump and to form an alloy between the semiconductor chip and an electrode of the substrate after the NCF 40 starts to be cured with heat. Hence, the heating start temperature and the rate of temperature increase need to be a combination of a heating start temperature and a rate of temperature increase at which the viscosity V of the NCF 40 is equal to or higher than the curing viscosity VS at a temperature lower than the melting start temperature TW of the metal bump.

First, a case of selecting a combination of the heating start temperature and the rate of temperature increase using the viscosity characteristic map 50 illustrated in FIG. 3 is described. A melting start temperature of the metal bump is represented by TW in FIG. 3. When the heating start temperature is set to T0 and the rate of temperature increase is set to A (° C./s) and B (° C./s), the viscosity V of the NCF 40 is equal to or higher than the curing viscosity VS at temperatures T1 and T2 which are lower than the melting start temperature TW of the metal bump as illustrated by the solid line a and the chain line b, and thus a combination of the heating start temperature T0 and the rates A and B of temperature increase is an employable combination. On the other hand, when the rate of temperature increase is set to C (° C./s) and D (° C./s), the viscosity V of the NCF 40 is not equal to or higher than the curing viscosity VS when the temperature is not higher than the melting start temperature TW of the metal bump, as illustrated by the two-dot chain line c and the circle-plotted line d. Hence, a melting state of the metal bump and a flowing state of the NCF occur simultaneously, the melted metal bump flows from the electrode due to the flowing of the NCF 40, and it is not possible to achieve appropriate joining. Hence, a combination of the heating start temperature T0 and the rates C and D of temperature increase is an unemployable combination.

Here, as the rate of temperature increase becomes higher, a tact time of the bonding can be shortened, and thus a combination having a higher rate of temperature increase is selected from employable combinations of the heating start temperatures and the rates of temperature increase.

In other words, from the viscosity characteristic map in FIG. 3, combinations of the heating start temperatures and the rates of temperature increase at which the viscosity V is equal to or higher than the curing viscosity VS at a temperature lower than the melting start temperature TW of the metal bump are selected, and a combination having the highest rate of temperature increase is selected as the heating condition from the combinations.

In addition, regarding the heating condition in a case of performing the bonding at a higher rate of temperature increase of C (° C./s), a combination of the heating start temperature and the rate of temperature increase at which the viscosity V is equal to or higher than the curing viscosity VS at a temperature lower than the melting start temperature TW of the metal bump, that is, a combination of the heating start temperature of T02 and the rate of temperature increase of C (° C./s) is selected as the heating condition, with reference to the heating start temperature characteristic map 60 illustrated in FIG. 4.

In the above description, the heating condition is selected on the basis of the lines illustrated on the heating start temperature characteristic map 60 of FIG. 4; however, the heating condition is not limited thereto. For example, the triangle-plotted line c1 and the x-plotted line c2 may be interpolated such that the heating start temperature is set to a temperature slightly lower than T02.

As described above, in the method for setting heating conditions of the embodiment, there is no need to perform test bonding in many heating conditions, and thus it is possible to set the heating condition in a short time.

Next, as illustrated in step S104 of FIG. 1, a step of setting a temperature command to the heater 23 on the basis of the selected heating start temperature and rate of temperature increase will be described.

Figure 5:
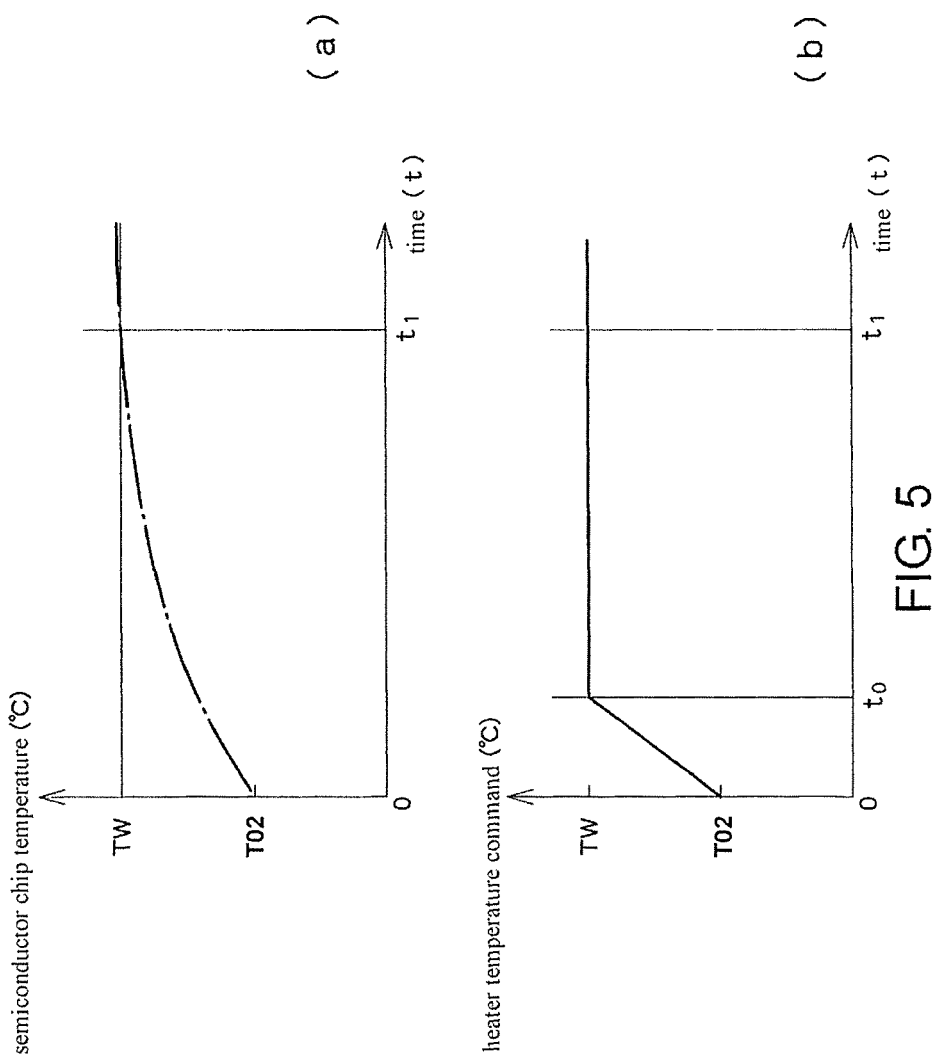
FIG. 5 illustrates graphs of a time change of a temperature of the NCF and a heater temperature command value based on a selected heating start temperature and rate of temperature increase.
Figure 6:
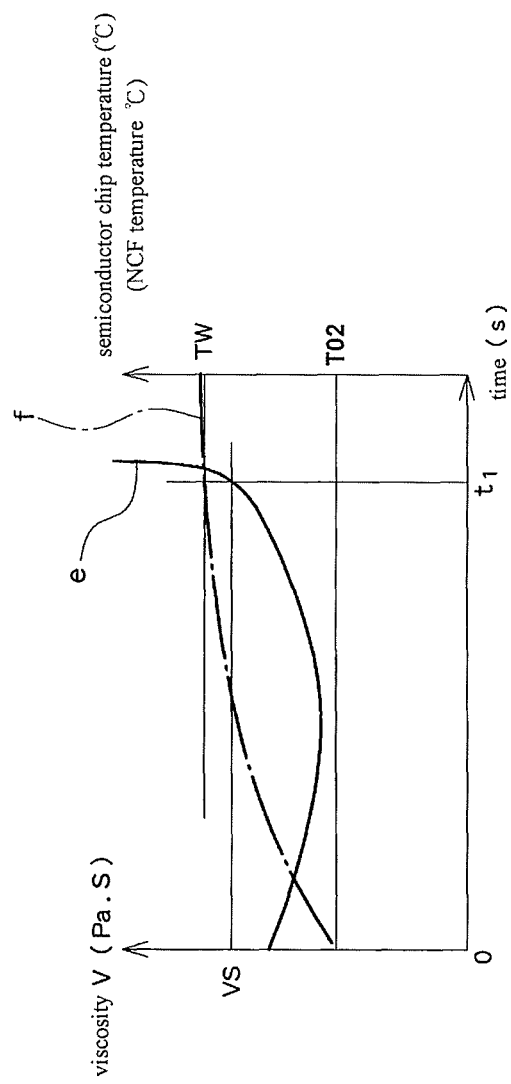
FIG. 6 illustrates a graph of a time change of the temperature of a semiconductor chip and the NCF and a time change of viscosity of the NCF, when bonding is performed based on the heater temperature command value set in FIG. 5.

(a) of FIG. 5 illustrates a curve (f) indicating a temperature increase of the semiconductor chip 31 or the NCF 40 with respect to time ($t_1$) when the heating start temperature is set to T02 and the rate of temperature increase is set to C (° C./s). (b) of FIG. 5 illustrates a curve (e) indicating a temperature increase of the semiconductor chip 31 or the NCF 40 with respect to time ($t_1$) when the heating start temperature is set to T02. A time delay occurs between the temperature command to the heater 23 and the temperature increase of the semiconductor chip 31 or the NCF 40. For the time delay, a numerical-value model is configured from tests and the like conducted in advance, and parameter setting is performed. Then, the temperature command to the heater 23 is generated as illustrated in (b) of FIG. 5 using the set parameter and the numerical-value model, wherein changes in temperature as illustrated in (a) of FIG. 5 are achieved under the temperature command. Then, during bonding, the heater 23 is controlled according to the temperature command illustrated in (b) of FIG. 5. As a result, as illustrated in FIG. 6, it is possible to obtain an efficient bonding condition in which the metal bump is melted immediately after the viscosity V of the NCF 40 reaches the curing viscosity VS. In this manner, according to the method for setting heating conditions, the bonding condition can be set in a short time ($t_0$).

In the above description, the case of selecting the combination of the heating start temperature and the rate of temperature increase by using the viscosity characteristic map 50 and the case of selecting the heating condition on the basis of the lines illustrated on the heating start temperature characteristic map 60 are described. However, the present invention is not limited to selecting the combination of the heating start temperature and the rate of temperature increase by using one map as described above, and a combination of the heating start temperature and the rate of temperature increase may be selected by using both maps.

REFERENCE SIGNS LIST 10 bonding stage
12 heater
14, 26 controller
20 bonding head
21 base
22 heat block
23 heater
24 bonding tool
25 drive unit
31, 32 semiconductor chip
50 viscosity characteristic map
60 heating start temperature characteristic map
90 control unit
91, 92 temperature sensor
100 bonding device

What is claimed is:
1. A heating condition setting method for setting conditions for heating a semiconductor chip during bonding of the semiconductor chip using a non-conductive film, the method comprising:
setting a heating start temperature and a rate of temperature increase on the basis of one or both of a viscosity characteristic map that indicates changes in viscosity with respect to temperature of the non-conductive film at various rates of temperature increase and a heating start temperature characteristic map that indicates changes in viscosity with respect to temperature of the non-conductive film when the heating start temperature is changed at the same rate of temperature increase,
wherein the viscosity characteristic map is obtained by measuring a lowered amount of a bonding tool while the temperature of the non-conductive film is increased at the various rates of temperature increase, in a state that the non-conductive film is sandwiched between a bonding stage and the bonding tool and is pressed with a constant load, calculating the viscosity of the non-conductive film on the basis of the lowered amount of the bonding tool, and outputting the calculated viscosity as characteristics of changes in viscosity with respect to temperature of the non-conductive film at various rates of temperature increase.

2. The heating condition setting method according to claim 1,
wherein in the bonding, a metal bump formed on the semiconductor chip is melted and an alloy is formed between the semiconductor chip and an electrode of a substrate or another semiconductor chip to thereby join the semiconductor chip to the substrate or another semiconductor chip, and the non-conductive film is cured with heat so as to fill a gap between the semiconductor chip and the substrate or another semiconductor chip, and
wherein the setting of the heating start temperature and the rate of temperature increase is selecting a combination of a heating start temperature and a rate of temperature increase at which viscosity of the non-conductive film is equal to or higher than curing viscosity at a temperature lower than a melting start temperature of the metal bump.

3. The heating condition setting method according to claim 1,
wherein a temperature command to a heater that heats the semiconductor chip is set on the basis of the set heating start temperature and rate of temperature increase.

4. The heating condition setting method according to claim 2,
wherein a temperature command to a heater that heats the semiconductor chip is set on the basis of the set heating start temperature and rate of temperature increase.

5. A heating condition setting method for setting conditions for heating a semiconductor chip during bonding of the semiconductor chip using a non-conductive film, the method comprising:
setting a heating start temperature and a rate of temperature increase on the basis of one or both of a viscosity characteristic map that indicates changes in viscosity with respect to temperature of the non-conductive film at various rates of temperature increase and a heating start temperature characteristic map that indicates changes in viscosity with respect to temperature of the non-conductive film when the heating start temperature is changed at the same rate of temperature increase,
wherein the heating start temperature characteristic map is obtained by measuring a lowered amount of a bonding tool while the temperature of the non-conductive film is increased from various heating start temperatures at the same rate of temperature increase, in a state that the non-conductive film is sandwiched between a bonding stage and the bonding tool and is pressed with a constant load, calculating the viscosity of the non-conductive film on the basis of the lowered amount of the bonding tool, and outputting the calculated viscosity as characteristics of changes in viscosity with respect to temperature of the non-conductive film when the heating start temperature is changed at the same rate of temperature increase.

6. The heating condition setting method according to claim 5,
wherein a temperature command to a heater that heats the semiconductor chip is set on the basis of the set heating start temperature and rate of temperature increase.

7. The heating condition setting method according to claim 5,
wherein in the bonding, a metal bump formed on the semiconductor chip is melted and an alloy is formed between the semiconductor chip and an electrode of a substrate or another semiconductor chip to thereby join the semiconductor chip to the substrate or another semiconductor chip, and the non-conductive film is cured with heat so as to fill a gap between the semiconductor chip and the substrate or another semiconductor chip, and
wherein the setting of the heating start temperature and the rate of temperature increase is selecting a combination of a heating start temperature and a rate of temperature increase at which viscosity of the non-conductive film is equal to or higher than curing viscosity at a temperature lower than a melting start temperature of the metal bump.

8. A method for measuring viscosity of a non-conductive film by using a bonding device, the method comprising:
measuring a lowered amount of a bonding tool while a temperature of the non-conductive film is increased at a predetermined rate of temperature increase, in a state that the non-conductive film is sandwiched between a bonding stage and the bonding tool and is pressed with a constant load; and
calculating the viscosity of the non-conductive film on the basis of the lowered amount of the bonding tool.

9. A bonding device comprising:
a bonding stage on which a non-conductive film is mounted;
a bonding tool that sandwiches the non-conductive film in cooperation with the bonding stage;
a bonding head that drives the bonding tool in an up-down direction;
a heater that is arranged in the bonding head; and
a control unit that adjusts a height of the bonding head and an output of the heater,
wherein the control unit
measures a lowered amount of the bonding tool while a temperature of the non-conductive film is increased by the heater at a predetermined rate of temperature increase, in a state that the bonding head is lowered to press the non-conductive film with a constant load, and
calculates the viscosity of the non-conductive film on the basis of the lowered amount of the bonding tool.

\* \* \* \* \*